(12) United States Patent
Yang

(10) Patent No.: US 9,754,680 B2
(45) Date of Patent: Sep. 5, 2017

(54) METHOD AND DEVICE FOR COMPACT EFUSE ARRAY

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Chia Chi Yang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/336,365

(22) Filed: Oct. 27, 2016

(65) Prior Publication Data

US 2017/0125120 A1     May 4, 2017

(30) Foreign Application Priority Data

Nov. 2, 2015  (CN) .......................... 2015 1 0731242

(51) Int. Cl.
  *G11C 17/16*   (2006.01)
  *G11C 17/18*   (2006.01)
(52) U.S. Cl.
  CPC .............. *G11C 17/18* (2013.01); *G11C 17/16* (2013.01)

(58) Field of Classification Search
  CPC ................................ G11C 17/18; G11C 17/16
  See application file for complete search history.

(56) References Cited

U.S. PATENT DOCUMENTS

| 6,385,075 | B1* | 5/2002 | Taussig | G11C 17/06 365/105 |
| 8,014,185 | B2* | 9/2011 | Scheuerlein | B82Y 10/00 365/100 |
| 2001/0017755 | A1* | 8/2001 | Toyoshima | H01L 27/0255 361/56 |
| 2012/0020177 | A1 | 1/2012 | Lin et al. | |

(Continued)

OTHER PUBLICATIONS

European Application No. 16196134.7, Extended European Search Report mailed on Mar. 24, 2017, 5 pages.

*Primary Examiner* — Khamdan Alrobaie
(74) *Attorney, Agent, or Firm* — Kilpatrick Townsend and Stockton

(57) ABSTRACT

An electrical fuse (eFuse) array includes eFuse cells arranged in multiple rows and columns. Each eFuse cell has an eFuse, a first diode, and a second diode coupled to an internal node, each eFuse cell further having first, second, and third terminals coupled, respectively, to the first diode, the second diode, and the eFuse. The eFuse array further includes a shared NMOSFET for each of the multiple rows, with a drain coupled to the third terminal of each of the plurality of eFuse cells in that row and a gate coupled to a word line. Each column includes a write bit line coupled to the second terminal of each of the eFuse cells in that column, and a read bit line coupled to the first terminal of the eFuse cell.

20 Claims, 5 Drawing Sheets

(56) References Cited

U.S. PATENT DOCUMENTS

| | | | |
|---|---|---|---|
| 2012/0044736 A1* | 2/2012 | Chung | ................ G11C 11/1659 365/66 |
| 2012/0314473 A1* | 12/2012 | Chung | ................ G11C 11/5678 365/96 |
| 2012/0320656 A1* | 12/2012 | Chung | .................... G11C 11/56 365/96 |
| 2014/0016394 A1* | 1/2014 | Chung | .................... G11C 17/16 365/96 |
| 2014/0160830 A1* | 6/2014 | Chung | ............... G11C 13/0004 365/96 |
| 2014/0269135 A1* | 9/2014 | Chung | .................... G11C 17/16 365/225.7 |
| 2015/0243365 A1 | 8/2015 | Pigott et al. | |

* cited by examiner

METHOD AND DEVICE FOR COMPACT EFUSE ARRAY

CROSS-REFERENCES TO RELATED APPLICATIONS

This application claims priority to Chinese patent application No. 201510731242.2, filed on Nov. 2, 2015, the content of which is incorporated herein by reference in its entirety.

BACKGROUND OF THE INVENTION

The present invention relates to the field of semiconductor technology. Specifically, embodiments of the invention are directed to an electrically programmable fuse (eFuse) cell array and memory device.

An eFuse is an electrically programmable memory device whose resistance can be changed by passing an electric current through it. It usually can be programmed only one time. Programmed eFuses are electrically high resistance, while unprogrammed eFuses remain in a low resistance state. An eFuse can be implemented using different technologies. For example, an eFuse can be made of a conductive line, which can transition to a high resistance state or can be broken by applying a large current through it. In another example, an eFuse can be made of a polysilicon line coated with a silicide layer. The programming current can cause the silicide layer to redistribute and be broken, resulting in the high resistance state. In computing, an eFuse allows for the dynamic real-time reprogramming of computer chips. By utilizing eFuses, a chip manufacturer can allow for the circuits on a chip to be changed by applying an electrical signal.

In a conventional eFuse (electrical programmable fuse) array, in order to achieve compatibility, all devices in the eFuse array are core devices. At the 28 nm technology node, for example, the operating voltage in the core devices is very low. The high voltage needed in programming or burning the eFuse can be a challenge. Some conventional methods have been proposed to overcome the high programming voltage eFuse array. For example, an LDO (Low dropout regulator) can be used to reduce the voltage to an acceptable level. However, this approach can result in a large area of the device.

In some conventional eFuse arrays, each eFuse cell has an eFuse and an NMOS transistor connected in series. Here the NMOS can be HVNMOS (high voltage NMOS), in which the gate voltage is close to the programming voltage. However, the area of the HVNMOS area is larger than the core device, resulting in peripheral circuits of such eFuse array becoming relatively large. Therefore, the size of a low capacity eFuse array can be dominated by the LDO circuit, and the size of a high-capacity eFuse can be dominated by the eFuse cell size.

The high voltage bit line operations in an eFuse array can adversely affect its reliability, e.g., the total number of operations. In addition, it is difficult to reduce the peripheral devices, which can include word line drivers, pass gate drivers, PMOS switches and drivers, as well as level converters, etc.

BRIEF SUMMARY OF THE INVENTION

The present invention relates to the field of semiconductor technology. Specifically, embodiments of the invention are directed to a compact electrically programmable fuse (eFuse) cell array and a storage unit.

According to some embodiments of the present invention, an electrical fuse (eFuse) memory device includes an eFuse array having a plurality of electrical fuse (eFuse) cells arranged in multiple rows and columns. Each eFuse cell has an eFuse, a first diode, and a second diode coupled to an internal node, each eFuse cell further having first, second, and third terminals. The first diode is coupled between the first terminal and the internal node, the second diode is coupled between the second terminal and the internal node, and the eFuse is coupled between the third terminal and the internal node. The eFuse array further includes a shared NMOSFET for each of the multiple rows, with a drain coupled to the third terminal of each of the plurality of eFuse cells in that row, the shared NMOSFET having a source coupled to a ground terminal and a gate coupled to a word line. The memory device also has a write bit line and a read bit line for each column. The write bit line is coupled to the second terminal of each of the eFuse cells in that column, and the read bit line is coupled to the first terminal of the eFuse cell.

In an embodiment of the eFuse memory device, each eFuse cell includes a PNP bipolar transistor, in which the first diode is formed by a first PN junction of the bipolar transistor, the second diode is formed by a second PN junction of the bipolar transistor, and the internal node is a base of the bipolar transistor.

In an embodiment, an anode of the first diode is coupled to the first terminal, and a cathode of the first is coupled to the internal node.

In an embodiment, an anode of the second diode is coupled to the second terminal, and a cathode of the second is coupled to the internal node.

In an embodiment, the plurality of electrical fuse (eFuse) cells comprises n by m eFuse cells arranged in an n by m matrix with n rows and m columns, n and m being integers. The memory device further includes n shared NMOSFETs and m write bit lines. In the ith row, "i" being an integer, the ith shared NMOSFET is coupled to each of the eFuse in the ith row. In the jth column, "j" being an integer, the jth write bit line is coupled to the second diode in each of the eFuse cells in the jth column.

In an embodiment, each eFuse cell also includes a read operation MOSFET coupled between the first diode and the read bit line, a gate terminal of the read operation MOSFET being coupled to a read control line.

In an embodiment, the read operation MOSFET is an NMOSFET with a source coupled to the anode of the first diode and a drain coupled to the read bit line. In another embodiment, the read operation MOSFET is a PMOSFET with a drain coupled to the anode of the first diode and a source coupled to the read bit line.

In an embodiment, the memory device also includes a word line decoder a write operation decoder, and a read unit.

In an embodiment, the memory device also includes a bit line PMOSFET for each of the m columns. In an embodiment, each eFuse cell is coupled to a read bit line.

According to some embodiments of the present invention, an electrical fuse (eFuse) cell includes first, second, and third terminals, an eFuse, and a PNP bipolar transistor having a first P-type region, an N-type base region, and a second P-type region. The first terminal is coupled to the first P-type region, the second terminal is coupled to the second P-type region, and the eFuse is coupled between the third terminal and the base region of the bipolar transistor.

In an embodiment of the eFuse cell, the first terminal is configured for coupling to a read bit line, the second terminal is configured for coupling to a write bit line, and the third terminal is configured for coupling to a shared NMOSFET, which is configured for coupling to the third terminals of all eFuse cells in a row of an array.

According to some embodiments of the invention, an electrically programmable fuse (eFuse) cell includes first, second, and third terminals, an eFuse, a first diode, and a second diode. The eFuse, the first diode, and the second diode are coupled to an internal node. The first diode is coupled between the first terminal and the internal node, the second diode is coupled between the second terminal and the internal node, and the eFuse is coupled between the third terminal and the internal node.

In an embodiment, the first terminal is configured for coupling to a read bit line, the second terminal is configured for coupling to a write bit line; and the third terminal is configured for coupling to a shared NMOSFET, which is configured for coupling to the third terminals of all eFuse cells in a row of an array.

In an embodiment, each eFuse cell includes a PNP bipolar transistor, in which the first diode is formed by a first PN junction of the bipolar transistor, the second diode is formed by a second PN junction of the bipolar transistor, and the internal node is a base of the bipolar transistor.

In an embodiment, the eFuse comprises a conductive material which is configured to transition from a low resistive state to a high resistive state when a programming current is applied. In an embodiment, the eFuse includes a polysilicon material with an overlying silicide layer.

The following description, together with the accompanying drawings, will provide further understanding of the nature and advantages of the claimed invention.

DETAILED DESCRIPTION OF THE INVENTION

Figure 1:
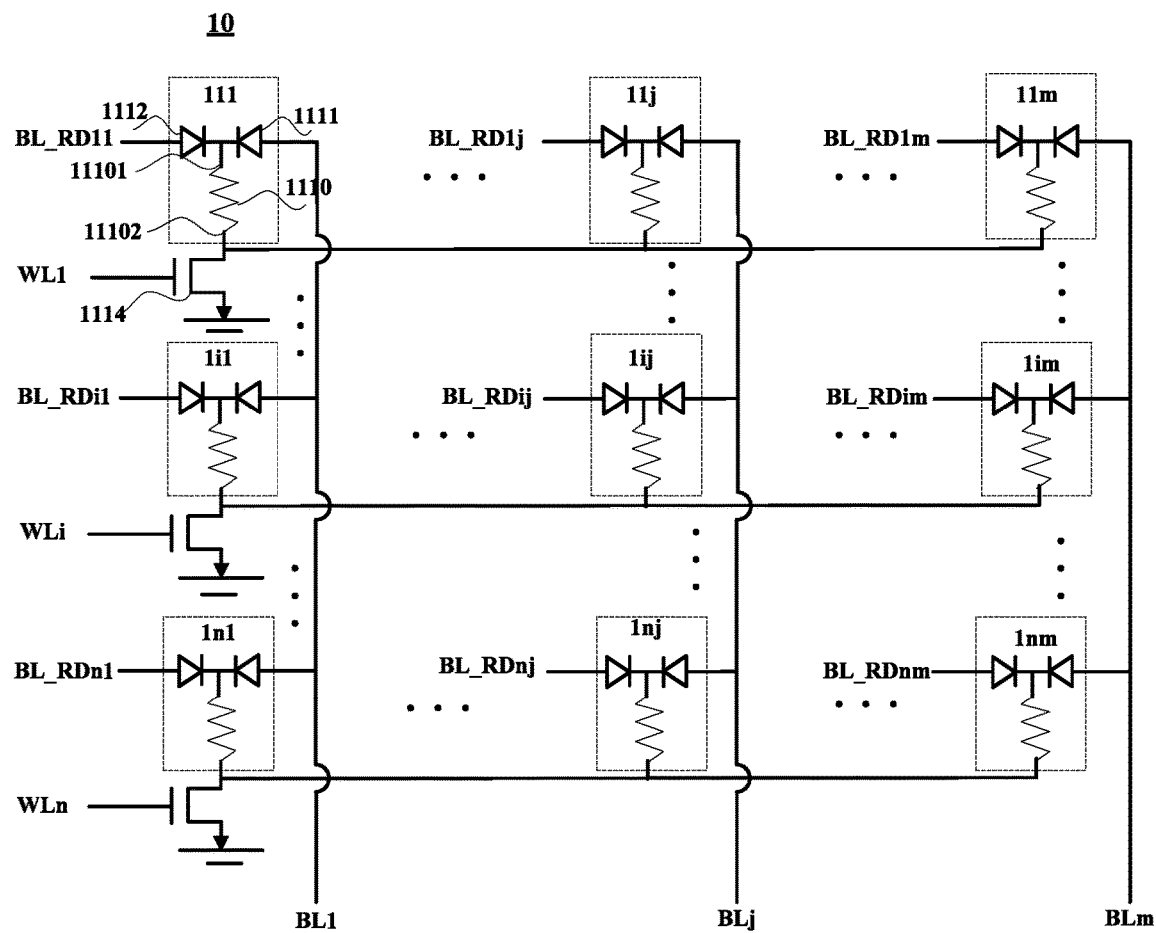
FIG. 1 is a simplified schematic diagram illustrating an electrical programmable fuse or electrical fuse (eFuse) cell array according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1 is a simplified schematic diagram illustrating an electrical programmable fuse or electrical fuse (eFuse) cell array according to an embodiment of the present invention. As shown in FIG. 1, the electrically programmable fuse cell array 10 includes n×m electrically programmable fuse cells, labeled 111, . . . 11$j$, . . . 11$m$, 1$i$1, . . . 1$ij$, . . . 1$im$, 1$n$1, . . . 1$nj$, . . . , 1$nm$, respectively. The following explanation will use eFuse cell 111 as an example.

As shown in FIG. 1, eFuse cell 111 includes an eFuse 1110, a first diode 1111, and a second diode 1112. Electrical programmable fuse or electrical fuse (eFuse) 1110 includes a first terminal 11101 and a second terminal 11102. Depending on the embodiments, diode 1111 can have a cathode coupled to eFuse 1110 and an anode coupled to a write bit line BL1. Diode 1112 can have a cathode coupled to eFuse 1110 and an anode coupled to a read bit line BL_RD11. The eFuse cells in the same row as eFuse cell 111 are connected to a shared NMOSFET 1114, which has a drain coupled to eFuse 1110, a gate coupled to a word line WL1, and a source coupled to a ground terminal. Other eFuse cells in eFuse cell array 10 are similar to eFuse cell 111, as shown in FIG. 1.

In conventional eFuse memories, each eFuse cell usually has an NMOS transistor, which occupies most of the area of the device. In embodiments of the invention, each row of the eFuse cells shares a shared NMOSFET (for example HVNMOS). Although each of the eFuse cells has two additional diodes, the overall area of the eFuse array can be reduced, thereby reducing the size of the device.

In some embodiments, the central core the device may operate at a voltage 1.05 V, and a voltage over 1.26V may cause reliability problems. Since the read operation is carried out with a voltage of 1.05 V, the diodes and other associated circuitry can be low-voltage core devices. Using low-voltage components can also reduce the device area.

In a write operation to cell 111, a high voltage is applied to write bit line BL1, another high voltage is applied to word line WL, and NMOSFET 1114 is turned on. A write current flows through write bit line BL1, diode 1111, fuse 1110, and shared NMOSFET 1114. This current causes fuse 1110 to be blown or transition to a high resistance state. Here, a fuse being "blown" can mean the fuse is literally broken, or it can mean the fuse resistance is increased by several orders of magnitude. In this embodiment, fuse cell 111 is referred to having been written with a value of "1." The diode limits the direction of the write current, and electron migration (EM) effect can cause the fuse to be blown.

The first diode 1111 in each eFuse cell can serve as a protection device when the cell is not being written. For example, when cell 111 is being written and cell 11$j$ is not being written, A voltage of 5 V is applied to write bit line BL1, and a voltage of 1V is applied to write bit line BL$j$. In this case, the diode in cell 11$j$ can block a current flowing from the shared NMOSFET through eFuse 11$j$. Cell 11$j$ is therefore protected.

In a read operation to cell 111, a voltage is applied to read bit line BL_RD 11, another voltage is applied to word line WL1, and shared NMOSFET 114 is turned on. A current flowing through this path can be used to determine the resistance of eFuse 1110. Depending on the resistance, it can be determined if the fuse is blown, and a value "1" or "0" can be determined. The read current is selected to be much lower than the write current to prevent damaging the fuse. For example, if a write current has a magnitude of 100 units, and the fuse has a safety rating of 10 units, the read current can be set at 1 unit to ensure reliability of the fuses.

In a conventional memory array, a long bit line is connected to many eFuse cells. The long bit line and the NMOS in each cell can present substantial capacitance. In embodiments of the invention, a diode in each cell is connected to the bit line. With the lower capacitance, the read speed can be increased.

The first and second diodes in each cell can prevent disturbance to adjacent cells during cell operation. For example, in a write operation, the first diode is forward biased, and the second diode is reverse biased which can prevent disturbing an adjacent cell. Similarly, in a read operation, the first diode is reverse biased, and the second diode is forward biased which can prevent disturbing an adjacent cell.

Figure 2:
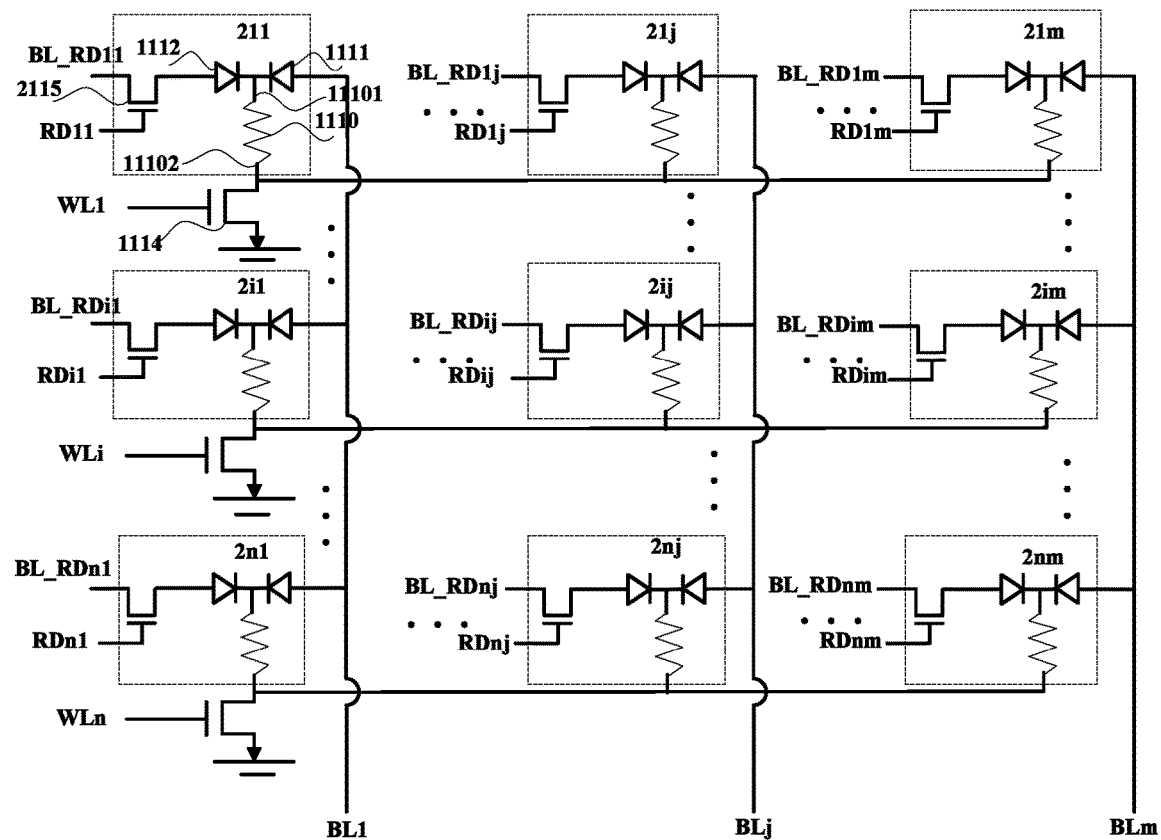
FIG. 2 is a simplified schematic diagram illustrating an electrical programmable fuse or electrical fuse (eFuse) cell array according to another embodiment of the present invention.

FIG. 2 is a simplified schematic diagram illustrating an electrical programmable fuse or electrical fuse (eFuse) cell array according to another embodiment of the present invention. As shown in FIG. 2, eFuse array 20 includes n×m eFuse cells, labeled 211, . . . 21*j*, . . . 21*m*, 2*il*, . . . 2*ij*, . . . 2*im*, 2*n*1, . . . 2*nj*, . . . , 2*nm*, respectively. The following explanation will use eFuse cell 211 as an example. Each cell, e. g., eFuse cell 211, includes an eFuse 1110, a first diode 1111, and a second diode 1112. Cell 211 also has a read operation MOSFET 2115 between diodes 1112 and a read bit line BL_RD11. The gate of MOSFET 2115 is coupled to a read operation control line RD11. Other cells in array 20 are similar to cell 211. Read operation MOSFET can be an NMOSFET or a PMOSFET, which are coupled between diode 112 and read operation bit line BL_ED11 with either source or drain terminals. Compared with array 10 in FIG. 1, the read operation MOSFET 2115 in array 20 can be used to select an eFuse cell for the read operation. The shared NMOSFET can still reduce the area of the array.

In embodiments of the invention, the shared HVNMOS can make the array smaller than the conventional array having an HVNMOS in each cell. Further, the read current can be increased by the larger shared HVNMOS in embodiments of the invention.

In some embodiments, an eFuse memory device has an array of a plurality of electrical fuse (eFuse) cells that can include n by m eFuse cells arranged in an n by m matrix with n rows and m columns. Here, n and m are positive integers equal to or greater than 1. The memory device also includes n shared NMOSFETs and m write bit lines. In the following description, I and j are integers equal to or greater than 1. In the ith row, the ith shared NMOSFET is coupled to each of the eFuse cells in the ith row. In the jth column, the jth write bit line is coupled to the second diode in each of the eFuse cells in the jth column. Each row of eFuse cells share a word line, and each column of eFuse cells shares a write operation bit line. In some embodiments, each eFuse cell further includes a read operation MOSFET coupled between the first diode and the read bit line, a gate terminal of the read operation MOSFET being coupled to a read control line. In some embodiments, the read operation MOSFET is an NMOSFET with a source coupled to the anode of the first diode and a drain coupled to the read bit line. In some embodiments, the read operation MOSFET is a PMOSFET with a drain coupled to the anode of the first diode and a source coupled to the read bit line.

Figure 3:
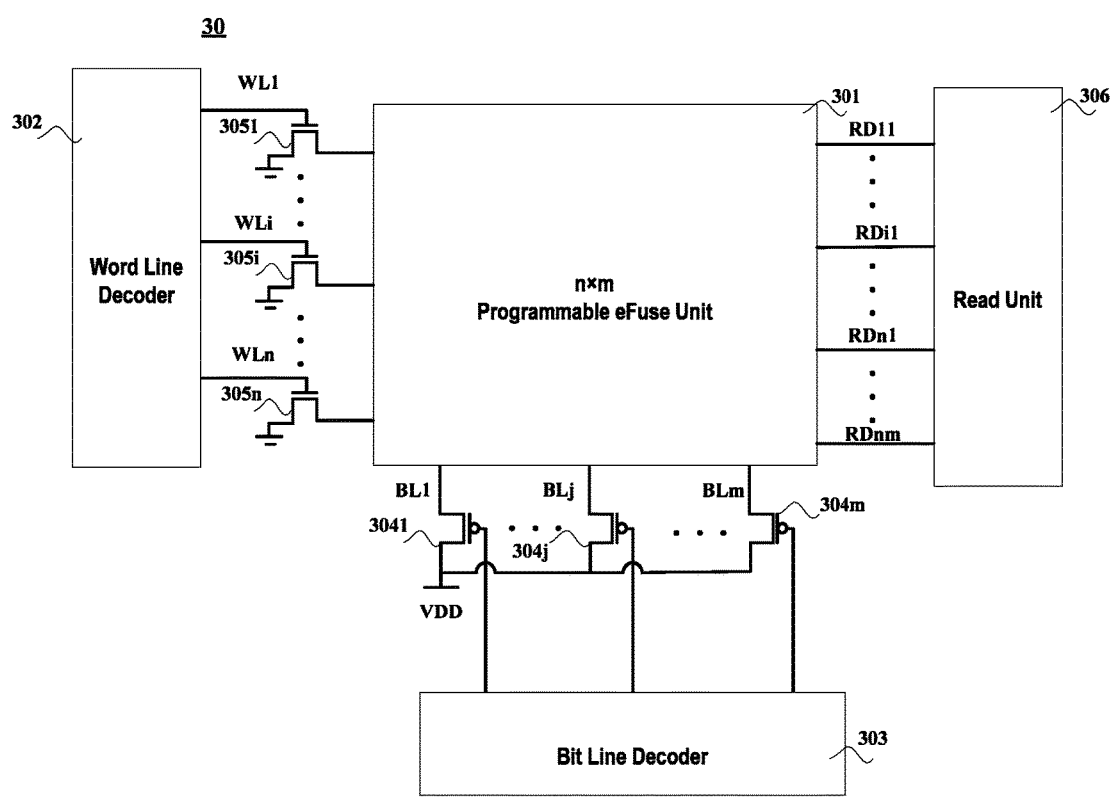
FIG. 3 is a simplified schematic diagram illustrating a memory device having an electrical programmable fuse or electrical fuse (eFuse) cell array according to an embodiment of the present invention.

FIG. 3 is a simplified schematic diagram illustrating a memory device having an electrical programmable fuse or electrical fuse (eFuse) cell array according to an embodiment of the present invention. As shown in FIG. 3, memory device 30 includes an eFuse array 301, which includes an n by m array of eFuse cells, n shared NMOSFETs 3051 to 305*n*, word line decoder 302, write operation bit line decoder 303, and m bit line PMOSFETs 3041 to 304*m*. The gate of the PMOSFET is coupled to a bit line, and a source is coupled to a power supply VDD. Each eFuse cell can be similar to eFuse cell 111 in FIG. 1 or eFuse cell 211 in FIG. 2 as described above. The word line and bit line arrangement is also similar to those described in connection to FIGS. 1 and 2. In a write operation, eFuse cell (i, j) can be written by the decoders selecting word line WLi and bit line BLj to turn on the jth shared NMOSFET and the ith bit line PMOSFET.

In some embodiments, memory device 30 can include an array as shown in FIG. 2, which includes a read operation MOSFET for each eFuse cell for receiving a read control signal RD11 to RDnm. Memory device 30 also includes a read unit 306 providing read control lines RD11 to RDnm.

In some embodiments, memory device 30 can include an array as shown in FIG. 1, which does not include a read operation MOSFET for each eFuse cell. In this case, the read unit 306 can provide a voltage to the read operation bit line to perform the read operation at a cell selected by the word line.

Those skilled in the art will understand that the memory device of the present invention may also include other components, e.g., PMOS drivers, shared NMOSFET drivers, pass gates, and control circuits, etc. To simplify the description, certain details well-known in the art have been omitted. Those skilled in the art can understand from the description the structure and operations of the memory device.

Figure 4:
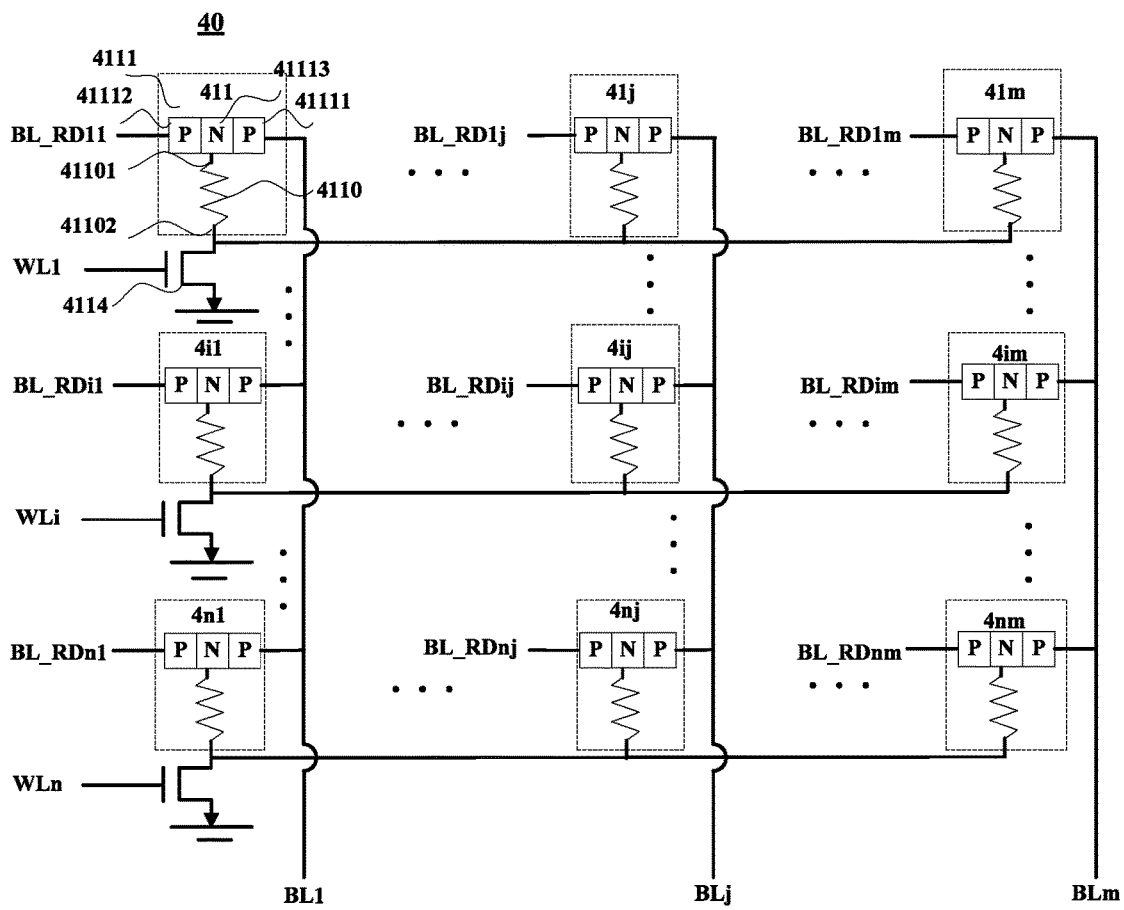
FIG. 4 is a simplified schematic diagram illustrating an electrical programmable fuse or electrical fuse (eFuse) cell array according to embodiment of the present invention.

FIG. 4 is a simplified schematic diagram illustrating an electrical programmable fuse or electrical fuse (eFuse) cell array according to an embodiment of the present invention. As shown in FIG. 4, the electrically programmable fuse cell array 40 includes: n×m electrically programmable fuse cells, labeled 411, . . . 41*j*, . . . 41*m*, 4*il*, . . . 4*ij*, . . . 4*im*, 4*n*1, . . . 4*nj*, . . . , 4*nm*, respectively. The following explanation will use eFuse cell 411 as an example.

As shown in FIG. 4, eFuse cell 411 includes an eFuse 4110 having a first terminal 41101 and a second terminal 41102, and a PNP transistor 4111 having an N-type region 41113, a first P-type region 41111 and a second P-type region 41112. In this embodiments, P-type region 41111 and N-type region 41113 function similarly to first diode 1111 in FIGS. 1 and 2. P-type region 41112 and N-type region 41113 function similarly to second diode 1112 in FIGS. 1 and 2. P-type region 41111 is coupled to write bit line BL1, and p-type region 41112 is coupled to a read bit line BL_RD11. Other components in FIG. 4 are also similar to the corresponding ones in FIG. 1. For example, a shared NMOSFET 4114 has a drain coupled to eFuse 4110, a gate coupled to a word line WL1, and a source coupled to a ground terminal.

The operations of eFuse array 40 are similar to those described above in connection with eFuse array 10 in FIG. 1. Further, eFuse array 40 can also be used in memory device 30 described in FIG. 3. Therefore, the descriptions are not repeated here. In eFuse array 40, a bipolar is used to replace the two diodes in FIG. 1. This arrangement can lead to reduced device size. The reduction in device size can come from the smaller bipolar transistor size and reduction of contacts and interconnects.

Figure 5:
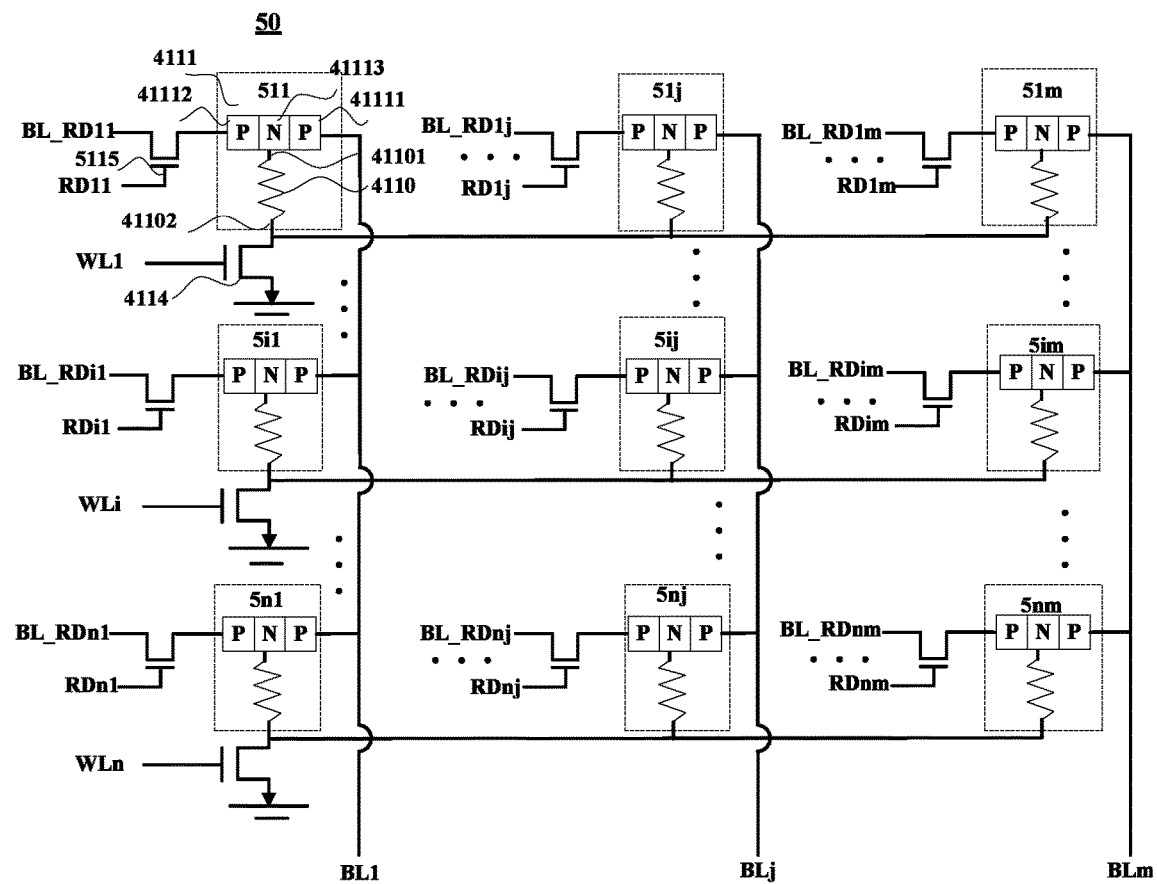
FIG. 5 is a simplified schematic diagram illustrating an electrical programmable fuse or electrical fuse (eFuse) cell array according to an embodiment of the present invention

FIG. 5 is a simplified schematic diagram illustrating an electrical programmable fuse or electrical fuse (eFuse) cell array according to an embodiment of the present invention. As shown in FIG. 5, the electrically programmable fuse cell array 50 includes: n×m electrically programmable fuse cells, labeled 511, ... 51j, ... 51m, 5il, ... 5ij, ... 5im, 5n1, ... 5nj, ... , 5nm, respectively. The following explanation will use eFuse cell 511 as an example. Each cell, e. g., eFuse cell 511, similar to eFuse cell 411 in FIG. 4, includes an eFuse 4110 and a bipolar transistor 4111. Unlike eFuse cell 411, eFuse cell 511 also has a read operation MOSFET 5115 disposed between a P type region 41112 and read bit line BL_RD11. The gate of MOSFET 5115 is coupled to a read operation control line RD11. Read operation MOSFET 5115 can be an NMOSFET or a PMOSFET, similar to cell 211 in FIG. 2. The operations of memory array 50 are similar eFuse cell 211 in FIG. 2, with a bipolar transistor replacing two diodes.

In some embodiments, an eFuse memory device has an array of a plurality of electrical fuse (eFuse) cells that can include n by m eFuse cells arranged in an n by m matrix with n rows and m columns. n and m are positive integers equal to or greater than 1. The memory device also includes n shared NMOSFETs and m write bit lines. In the ith row, the ith shared NMOSFET is coupled to each of the eFuse cells in the ith row. In the jth column, the jth write bit line is coupled to the second diode in each of the eFuse cells in the jth column. Each row of eFuse cells shares a word line, and each column of eFuse cells shares a write operation bit line. The memory device can include an eFuse array 40 or an eFuse array 50. Therefore, the descriptions are not repeated here. In eFuse arrays 40 and 50, a bipolar is used to replace the two diodes in FIGS. 1 and 2. This arrangement can lead to reduced device size. The reduction in device size can come from the smaller bipolar transistor size and reduction of contacts and interconnects.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. An electrical fuse (eFuse) memory device, comprising:
   an eFuse array having a plurality of electrical fuse (eFuse) cells arranged in multiple rows and columns, each eFuse cell having an eFuse, a first diode, and a second diode coupled to an internal node, each eFuse cell further having first, second, and third terminals, wherein:
      the first diode is coupled between the first terminal and the internal node;
      the second diode is coupled between the second terminal and the internal node; and
      the eFuse is coupled between the third terminal and the internal node;
   a shared NMOSFET for each of the multiple rows, with a drain coupled to the third terminal of each of the plurality of eFuse cells in that row, a source coupled to a ground terminal, and a gate coupled to a word line;
   a write bit line for each column, the write bit line coupled to the second terminal of each of the eFuse cells in that column; and
   a read bit line for each column, the read bit line coupled to the first terminal of the eFuse cell.

2. The memory device of claim 1, wherein each eFuse cell comprises a PNP bipolar transistor, wherein the first diode is formed by a first PN junction of the bipolar transistor, the second diode is formed by a second PN junction of the bipolar transistor, and the internal node is a base of the bipolar transistor.

3. The memory device of claim 1, wherein an anode of the first diode is coupled to the first terminal, and a cathode of the first diode is coupled to the internal node.

4. The memory device of claim 1, wherein an anode of the second diode is coupled to the second terminal, and a cathode of the second is coupled to the internal node.

5. The memory device of claim 1, wherein the plurality of electrical fuse (eFuse) cells comprises n by m eFuse cells arranged in an n by m matrix with n rows and m columns, n and m being integers;
   the memory device further comprises n shared NMOSFETs and m write bit lines;
   in the ith row, "i" being an integer, the ith shared NMOSFET is coupled to each of the eFuse cells in the ith row;
   in the jth column, "j" being an integer, the jth write bit line is coupled to the second diode in each of the eFuse cells in the jth column.

6. The memory device of claim 1, wherein each eFuse cell further comprises a read operation MOSFET coupled between the first diode and the read bit line, a gate terminal of the read operation MOSFET being coupled to a read control line.

7. The memory device of claim 6, wherein the read operation MOSFET is an NMOSFET with a source coupled to the anode of the first diode and a drain coupled to the read bit line.

8. The memory device of claim 6, wherein the read operation MOSFET is a PMOSFET with a drain coupled to the anode of the first diode and a source coupled to the read bit line.

9. The memory device of claim 6, further comprising a word line decoder and write operation decoder, and a read unit.

10. The memory device of claim 9, further comprising a bit line PMOSFET for each of the m columns.

11. The memory device of claim 9, wherein each eFuse cell is coupled to a read bit line.

12. The memory device of claim 1, wherein each eFuse cell comprises a conductive material which is configured to transition from a low resistive state to a high resistive state when a programming current is applied.

13. An electrical fuse (eFuse) cell, comprising:
   first, second, and third terminals;
   an eFuse; and
   a PNP bipolar transistor having a first P-type region, an N-type base region, and a second P-type region;
   wherein:
   the first terminal is coupled to the first P-type region and configured for coupling to a read bit line;
   the second terminal is coupled to the second P-type region and configured for coupling to a write bit line; and
   the eFuse is coupled between the third terminal and the N-type base region of the bipolar transistor, the third terminal being configured for coupling to a shared NMOSFET, and the shared NMOSFET being configured for coupling to the third terminals of all eFuse cells in a row of an array.

14. The eFuse cell of claim 13, wherein the eFuse comprises a conductive material which is configured to transition from a low resistive state to a high resistive state when a programming current is applied.

15. An electrically programmable fuse (eFuse) cell, comprising:
   first, second, and third terminals;
   an eFuse;
   a first diode; and
   a second diode;
   wherein:
   the eFuse, the first diode, and the second diode are coupled to an internal node,
   the first diode is coupled between the first terminal and the internal node;
   the second diode is coupled between the second terminal and the internal node;
   the eFuse is coupled between the third terminal and the internal node;
   the first terminal is configured for coupling to a read bit line;
   the second terminal is configured for coupling to a write bit line; and
   the third terminal is configured for coupling to a shared NMOSFET, the shared NMOSFET configured for coupling to the third terminals of all eFuse cells in a row of an array.

16. The eFuse cell of claim 15, wherein each eFuse cell comprises a PNP bipolar transistor, wherein the first diode is formed by a first PN junction of the bipolar transistor, the second diode is formed by a second PN junction of the bipolar transistor, and the internal node is a base of the bipolar transistor.

17. The eFuse cell of claim 15, wherein the eFuse comprises a conductive material which is configured to transition from a low resistive state to a high resistive state when a programming current is applied.

18. The eFuse cell of claim 17, wherein the eFuse comprises a polysilicon material with an overlying silicide layer.

19. The eFuse cell of claim 13, wherein the first P-type region is an anode and the N-type base region is a cathode of a first diode; and the second P-type region is an anode and the N-type base region is a cathode of a second diode.

20. The eFuse cell of claim 13, wherein the shared NMOSFET has a drain coupled to the eFuse, a gate coupled to a word line, and a source coupled to a ground terminal.

* * * * *